United States Patent
Matsue

(10) Patent No.: US 7,180,794 B2
(45) Date of Patent: Feb. 20, 2007

(54) OSCILLATING CIRCUIT, BOOSTER CIRCUIT, NONVOLATILE MEMORY DEVICE, AND SEMICONDUCTOR DEVICE

(75) Inventor: Kazuki Matsue, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 196 days.

(21) Appl. No.: 10/496,807

(22) PCT Filed: Nov. 29, 2002

(86) PCT No.: PCT/JP02/12574

§ 371 (c)(1),
(2), (4) Date: Oct. 15, 2004

(87) PCT Pub. No.: WO03/047100

PCT Pub. Date: Jun. 5, 2003

(65) Prior Publication Data

US 2005/0063231 A1    Mar. 24, 2005

(30) Foreign Application Priority Data

Nov. 30, 2001 (JP) .............................. 2001-366839

(51) Int. Cl.
*G11C 7/00* (2006.01)
*G11C 8/00* (2006.01)

(52) U.S. Cl. ............................ 365/189.09; 365/189.11; 327/534; 327/536

(58) Field of Classification Search ........... 365/189.09, 365/189.11; 327/534, 536; 331/111, 57
See application file for complete search history.

(56) References Cited

U.S. PATENT DOCUMENTS

| | | | | |
|---|---|---|---|---|
| 4,831,592 A | * | 5/1989 | Nakai et al. | 365/189.09 |
| 5,315,547 A | * | 5/1994 | Shoji et al. | 365/185.12 |
| 5,465,063 A | | 11/1995 | Fukuda et al. | |
| 5,708,396 A | | 1/1998 | Mizuno et al. | |
| 6,137,732 A | | 10/2000 | Inaba et al. | |
| 6,147,566 A | * | 11/2000 | Pizzuto et al. | 331/111 |

FOREIGN PATENT DOCUMENTS

| | | |
|---|---|---|
| EP | 0 670 632 A1 | 9/1995 |
| JP | 55-115717 A | 9/1980 |
| JP | 57-97218 A | 6/1982 |
| JP | 5-325578 A | 12/1993 |
| JP | 8-190798 A | 7/1996 |
| JP | 10-242811 A | 9/1998 |

* cited by examiner

*Primary Examiner*—Son T. Dinh
(74) *Attorney, Agent, or Firm*—Birch, Stewart, Kolasch and Birch, LLP

(57) ABSTRACT

In a ring oscillator constituting an oscillating circuit, resistor circuits are used as delay circuits to be connected to respective inverters. That is, the inverters and the resistors are connected in series so that the resistor is provided between the adjacent inverters. With the arrangement, it is possible to provide an oscillating circuit which is less dependent on any of power supply voltages, temperatures, and manufacturing variations, while maintaining a characteristic in which the oscillating frequency decreases as an output voltage of a booster circuit increases.

18 Claims, 8 Drawing Sheets

OSCILLATING CIRCUIT, BOOSTER CIRCUIT, NONVOLATILE MEMORY DEVICE, AND SEMICONDUCTOR DEVICE

This application is the national phase under 35 U.S.C. § 371 of PCT International Application No. PCT/JP02/12574 which has an International filing date of Nov. 29, 2002, which designated the United States of America.

This nonprovisional application claims priority under 35 U.S.C. § 119(a) on Patent Application No. 2001-366839 filed in JAPAN on Nov. 30, 2001, which is herein incorporated by reference.

TECHNICAL FIELD

The present invention relates to an oscillating circuit which controls the operation of a booster circuit for use in a nonvolatile memory device such as a flash memory.

BACKGROUND ART

A flash memory is one of the semiconductors which have an electrically rewritable nonvolatile memory area. The structure of a typical memory cell of the flash memory is shown in FIG. 4. This memory cell has a structure of 1 cell/1-bit, and is composed of a control gate 51, a floating gate 52, a source 53, and a drain 54. A transistor of such a structure is called a field effect transistor of floating-gate type.

FIG. 5 shows a part of a structure of a memory cell array including the above-mentioned memory cells. As shown in FIG. 5, the memory cell array is arranged so as to include m pieces of memory cells provided in a lengthwise direction and n pieces of memory cells provided in a crosswise direction in a matrix manner. The memory cell array further includes (i) m word lines WL1 through WLm that are connected commonly to the control gates 51 of the respective memory cells provided in the crosswise direction, and (ii) n bit lines BL1 through BLn that are connected commonly to the drains 54 of the respective memory cells provided in the lengthwise direction. The memory cell array further includes a source line SL that is connected commonly to the sources 53 of all the memory cells in a predetermined block.

Here, an operation in the memory cell array of the above structure is described briefly. The writing operation to the memory cell is performed as follows. First, a high voltage (for example, 12V) is supplied to the control gates 51 via the word line WL selected. Similarly, a high voltage (for example, 7V) is supplied to the drains 54 via the bit line BL selected. A low voltage (for example, 0V) is supplied to the sources 53. Under the circumstances, hot electrons generated near each of the drain junctions are injected into each of the floating gates 52. Thereby, the writing operation to the memory cell is completed.

On the other hand, an erasure operation to the memory cell is performed as follows. First, a low voltage (for example, 0V) is supplied to the control gates 51, a low voltage (for example, 0V) is supplied to the drain 54, and a high voltage (for example, 12V) is supplied to the sources 53. This causes, in the memory cell, a high electric field to be generated between the floating gate 52 and the source 53, and the electrons in the floating-gate is pulled toward the source 53 because of a tunneling effect. Thereby, the erasure operation to the memory cell is completed.

A read-out operation with respect to the memory cell is performed as follows. First, a high voltage (for example, 5V) is supplied to the control gates 51. Similarly, a low voltage (for example, 1V) is supplied to the drains 54, and a low voltage (for example, 0V) is supplied to the sources 53. And, the amplitude of the current flowing through the memory cell is amplified by an internal sense amplifier. "1" or "0" of data is judged in accordance with the current amplified.

Note that, during the writing, the voltage supplied to drains 54 is set lower than the voltage supplied to the control gates 51. This is because it is intended to avoid a parasitic weak writing (soft program) to the memory cell as much as possible. This is based on the fact that the plural memory cells are connected to a single word line and a single bit line, as mentioned above.

Thus, in order to perform the writing operation and the erasure operation (hereinafter referred to as "rewriting operation") of the flash memory with high reliability, very complicated controls are needed. In view of the circumstances, in order to make the apparent usability better, many of recent semiconductor devices which carry the flash memory include a control circuit referred to as a state machine, and they can rewrite automatically.

In addition to the above memory cell array, the flash memory includes a control circuit, a booster circuit, a writing/erasure voltage generating circuit, a row decoder, a column decoder, and other circuits. The booster circuit operates during the writing of data, and generates a predetermined high voltage. The high voltage generated by this booster circuit is converted, by the writing/erasure voltage generating circuit, into a voltage needed during the writing/erasure operation. The voltage thus converted is supplied to the memory cell array, via the row decoder. Such a rewriting operation and a read-out operation are respectively performed under the control of the control circuit.

As described above, in a flash memory which is operated by a single power supply, the high voltage needed is generally generated by a built-in booster circuit. The booster circuit includes an oscillating circuit, a pump cell circuit, a reference voltage generating circuit, a comparator, a diode chain, and other circuits.

The comparator compares a reference voltage (a fixed voltage) outputted by the reference voltage generating circuit with a voltage that is obtained by stepping down an output voltage of the booster circuit via the diode chain. In accordance with a difference between the reference voltage and the voltage stepped down, the comparator outputs a bias signal for adjusting an oscillation frequency of the oscillating circuit. The oscillating circuit outputs an oscillating signal in response to the bias signal. The pump cell circuit boosts and outputs an inputted voltage in accordance with the oscillation signal.

An example of the conventional oscillating circuit is shown in FIG. 9. An oscillating circuit mainly includes a ring oscillator in which inverters NOT1 through NOT9 of odd number-stage (nine-stage in FIG. 9) are connected to each other in series. When it is assumed that a rising time of the inverter is indicated by Tr, a falling time of the inverter is indicated by Tf, and the number of stages of the inverters is indicated by 2n+1, the cycle of the oscillating circuit can be indicated by (2n+1)(Tr+Tf). When a wiring between two neighboring inverters is shortened, it is possible to reduce the influence of the nonuniformity of the oscillation cycle caused by the wiring load. This is because the delay time caused by the wiring load is shorter than the rising time or the falling time of the inverter.. Capacitors C1 through C9 shown in FIG. 9 are provided for an adjusting oscillating frequency so that the oscillating frequency does not become too large. That is, the capacitors C1 through C9 respectively function as delay circuits corresponding to the time required for charging or discharging the respective electric capacitance.

The above-mentioned capacitor may be realized by the electric capacitance made by two-layer polysilicons (hereinafter sometimes referred to as "poly" for short). The capacitor of such a structure is obtained by laminating a polysilicon or a metal on a gate poly after the gate poly is oxidized. The capacitor operates with high accuracy, and its characteristics change very little even if ambient temperature or the voltage changes. When the electric capacitance of the respective capacitors C1 through C9 shown in FIG. 9 is set to be larger enough than the parasitic capacity of the wiring (for example, 0.15 pF), most influences of parasitic capacity can be disregarded.

When an oscillating circuit does not operate, a start-up signal EN becomes a Low level and a BIAS signal becomes a High level. At this time, transistors P1–P9 and N–N9, which are connected to a power supply line of the inverters NOT1 through NOT9 and a GND line, respectively, will be turned off. This causes each input or output of the inverters becomes uncertain. However, since transistors N11, N12, N14 (not shown), N16 (not shown), N18 (not shown), P13, P15 (not shown), P17 (not shown), and P19 are turned on, the electric potential of the node to which each transistor is connected is determined.

An oscillating signal OSC outputted from the oscillating circuit is supplied to the pump cell circuit via an inverter NOT20. FIG. 9 deals with a case where the oscillating signal OSC is taken out from the output of the inverter NOT1. However, the oscillating signal OSC is not limited to this, provided that it is taken out from any one of the inverters (NOT1–NOT9 in FIG. 9) constituting the ring oscillator.

However, even if a capacitor whose characteristics change very little due to the changes in the ambient temperature or the voltage is used, the oscillating frequency of this ring oscillator will fall in proportion to decrease in the power supply voltage. This is because of the transistor characteristics of the inverters NOT1 through NOT9 constituting the ring oscillator. Moreover, the oscillating frequency will also be changed by the fluctuation in thresholds of the transistors generated during the manufacturing of the transistors, and by operating temperatures. For this reason, the booster circuit designed to operate with the minimum power supply voltage value will have the current supply capacity more than necessary when the maximum power supply voltage value is supplied to the booster circuit. As a result, the electric power supply will be wasted.

A conventional technology to solve the above-mentioned problem is disclosed in Japanese Patent Application Laid-Open (kokai) No. 325578/1993 (publication date: Dec. 10, 1993)." According to a method disclosed in this publication, it is possible to obtain the current supply capacity without depending on a power supply voltage, by making the oscillating frequency of an oscillating circuit higher in proportion to decrease in the power supply voltage.

The circuit structure disclosed in the publication includes (i) a nonvolatile memory main body, (ii) an oscillating circuit whose oscillation frequency becomes higher in proportion to decrease in the power supply voltage, and (iii) a booster circuit which generates a voltage required at the time of the writing/erasure of the above-mentioned memory means by boosting the power supply voltage in response to the driving of the above-mentioned oscillating circuit. The current supply capacity of the booster circuit tends to decline in proportion to decrease in the power supply voltage. However, the oscillating frequency of the oscillating circuit for driving the booster circuit becomes high in proportion to decrease in the power supply voltage. This negates the lowering of this current supply capacity. Thus, the booster circuit having the current supply capacity which does not depend on the power supply voltage is realized. On this account, it is possible to eliminate the waste of the electric power supply power due to the fluctuation of the power supply voltage during the writing/erasure.

Furthermore, according to a disclosure of Japanese Patent Application Laid-Open (kokai) No. 190798/1996 (publication date: Jul. 23, 1996)", a nonvolatile semiconductor memory device includes a booster circuit having a boosting capability which is independent of manufacturing variations or the temperature change, thereby eliminating the waste of the electric power supply power during the writing/erasure. Such a nonvolatile semiconductor memory device has a similar circuitry to Japanese Patent Application Laid-Open (kokai) No. 325578/1993, except for an the oscillating circuit, in which a feature of memory device resides. A ring oscillator in the oscillating circuit is arranged such that a plurality of inverter circuits are mutually and circularly connected via respective MOS transistors for electric charge transfer. Gate electrodes of the MOS transistors are connected to output terminals of a voltage conversion circuit whose output voltage changes such that a transmission capability of the MOS transistor is improved in proportion to decrease in a power supply voltage.

However, these two conventional technologies mentioned above couldn't avoid the following problems. That is, there are two kinds of purposes for which the booster circuit has to supply the current quantity during a rewriting operation. One is for charging the load capacity, and the other is for supplying to DC paths. Note that the supplying of the current is no longer needed, once the load capacity is charged up to a high voltage. Moreover, since the rewriting operation is complicated as stated above, the DC path is not always generated. This causes the occurrence of a period in which a high potential is required only to be held. That is, the current quantity which the booster circuit has to supply will not be fixed. In this regard, in the two above-mentioned conventional technologies, the circuits are designed to hold the maximum current quantity required for the rewriting. This results in that the electric power supply power will be wasted when the current quantity less than the maximum current quantity is required.

As mentioned above, the conventional nonvolatile memory is designed so as to guarantee a proper operation even under the condition of the minimum current supply capacity, in view of (i) the fluctuation in the power supply voltage during the rewriting, (ii) the manufacturing variations, and (iii) the change, in the current supply capability of the booster circuit or the like, caused by the operation temperature. Therefore, as mentioned above, when the current supply capability less than the maximum one is necessary, there was a problem that the waste of electric power supply power happens.

Moreover, even if the arrangements like Japanese Patent Application Laid-Open (kokai) No. 325578/1993, or Japanese Patent Application Laid-Open (kokai) No. 190798/1996 is adopted in order to solve the problem of the change in the current supply capability, the waste of the electric power supply happens. This is because the circuit will be designed according to the maximum current supply quantity required for the booster circuit, if the current supply quantity changes during a series of operations such as the rewriting operation.

The present invention is made to solve the above-mentioned problems, and the object is to provide an oscillating circuit, a booster circuit, a nonvolatile memory device, and semiconductor device that have a feature that the oscillation frequency becomes low as the output voltage of a booster circuit becomes high, and that don't depend so much on any of the power supply voltage, temperature, or manufacturing variations.

SUMMARY OF INVENTION

To solve the above-mentioned problem, an oscillating circuit in accordance with the present invention includes a ring oscillator in which a plurality of inverters are circularly connected, which outputs a signal whose oscillating frequency changes in response to an inputted voltage, the oscillating circuit, further includes: delay circuits connected to the respective inverters, the delay circuit including a resistor circuit whose, resistance sets a time constant of the delay circuit.

With the arrangement, the delay circuits, connected to the respective inverters constituting the ring oscillator, include the respective resistor circuits. Here, first of all, the comparison with the conventional arrangement in which the delay circuit is constituted by a capacity is explained. When a capacitor is inserted as a delay circuit, the change in the capacities of capacitors due to manufacturing variations, operating temperatures, and power supply voltages are subtle. As such, the time required for charging and discharging the capacitor is affected by the performance of the inverter which constitutes the ring oscillator. Thus, like the conventional arrangement, when the delay circuit is constituted by a capacity, it is not possible to suppress the variation in the oscillating frequencies of the output signal due to the change in rising time and falling time of the inverter which constitutes the ring oscillator.

In contrast, according to the arrangement of the present invention, the delay circuit includes the resistor circuit. The change in the resistances of the resistor circuit due to operating temperatures, power supply voltages are subtle, and manufacturing variations are also comparatively subtle. The change in the delay time of a resistor circuit can be made smaller compared with the change in the rising time and the fall time of the inverter. Therefore, it becomes possible to suppress the variation in the oscillating frequencies of an output signal by increasing the resistance of the resistor circuit so that the rate of the delay time of the resistor circuit to an oscillating cycle becomes large.

Moreover, when this oscillating circuit is applied to a booster circuit which performs boosting of a voltage, it becomes possible to suppress the change in the oscillating frequencies in the oscillating circuit to a low level. As such, it becomes possible to make small a range in which the rising of the voltage changes. Therefore, it becomes possible to make relatively smaller the peak value of power consumption when the rising of the voltage is the fastest.

Next, for example, the comparison with the arrangement disclosed in Japanese Patent Application Laid-Open (kokai) No. 190798/1996 is explained. In this conventional arrangement, an oscillating circuit is designed so that an oscillating frequency becomes higher as the power supply voltage becomes lower. In this arrangement, the current consumption goes up as the voltage rises, and when the current consumption reaches to a predetermined voltage value, the oscillating circuit operates so that the current consumption value is maintained.

Here, the current for charging a load capacity becomes unnecessary, once a high voltage charges the load capacity. Accordingly, the current more than necessary will continue to be consumed in this arrangement. That is, in this arrangement, although the current consumption during the rising of the voltage can be reduced, there arises the problem that the total current consumption increases more than necessary when a steady-state current flows.

In contrast, according to the arrangement of the present invention, an oscillating circuit is not designed so that an oscillating frequency becomes higher as the power supply voltage becomes lower. As such, in cases where it is applied to the above booster circuit, after a voltage reaches a predetermined value, the current consumption decreases to such a degree that the voltage is maintained. This allows the steady-state current consumption not to increase.

As mentioned above, according to the arrangement of the present invention, it becomes possible to reduce the current consumption both in a steady state and during the rising of the voltage, respectively.

Moreover, a booster circuit of the present invention, includes: an oscillating circuit of the present invention; and a pump cell circuit which carries out a booster operation of a voltage in accordance with an oscillating frequency of a signal outputted from the oscillating circuit.

In the arrangement, the boost operation of the voltage is performed by the pump cell circuit in accordance with the oscillating frequency of a signal outputted from the oscillating circuit of the present invention. Note that, as described above, since this oscillating circuit can suppress the change in the oscillating frequencies to a low level, it becomes possible to make small a range in which the rising of the voltage changes. Therefore, it becomes possible to make relatively small the peak value of the power consumption when the rising of the voltage is the fastest.

Moreover, as described above, after a voltage reaches a predetermined value, the current consumption decreases to such a degree that the voltage is, maintained. This allows the steady-state current consumption to be suppressed to a low level.

In addition, according to the booster circuit, the absolute value of the voltage is increased regardless of the positive or negative of the voltage.

Moreover, a nonvolatile memory device of the present invention includes: a booster circuit of the present invention; and an electrically rewritable nonvolatile memory device, in which; a rewriting operation to the nonvolatile memory device is carried out in accordance with the voltage generated by the booster circuit.

In the arrangement, the rewriting operation to the nonvolatile memory device is performed in accordance with the voltage generated by the booster circuit. Here, as described above, it becomes possible to reduce the current consumption both in a steady state and during the rising of the voltage, respectively. As such, it is possible to provide a nonvolatile memory device which has such effects.

Moreover, a semiconductor device of the present invention includes a nonvolatile memory device of the present invention, and a control section which controls writing, erasure, and read-out operations to the nonvolatile memory device.

In the arrangement, the control section which controls the operations of the nonvolatile memory device of the present invention is provided. Here, as described above, it becomes possible to reduce the current consumption both in a steady state and during the rising of the voltage, respectively. As such, it is possible to provide a semiconductor device whose current consumption is small.

Additional objects, features, and strengths of the present invention will be made clear by the description below. Further, the advantages of the present invention will be evident from the following explanation in reference to the drawings.

DETAILED DESCRIPTION THE INVENTION

The following description deals with an embodiment of the present invention with reference to FIG. 1 through FIG. 8.

Figure 3:
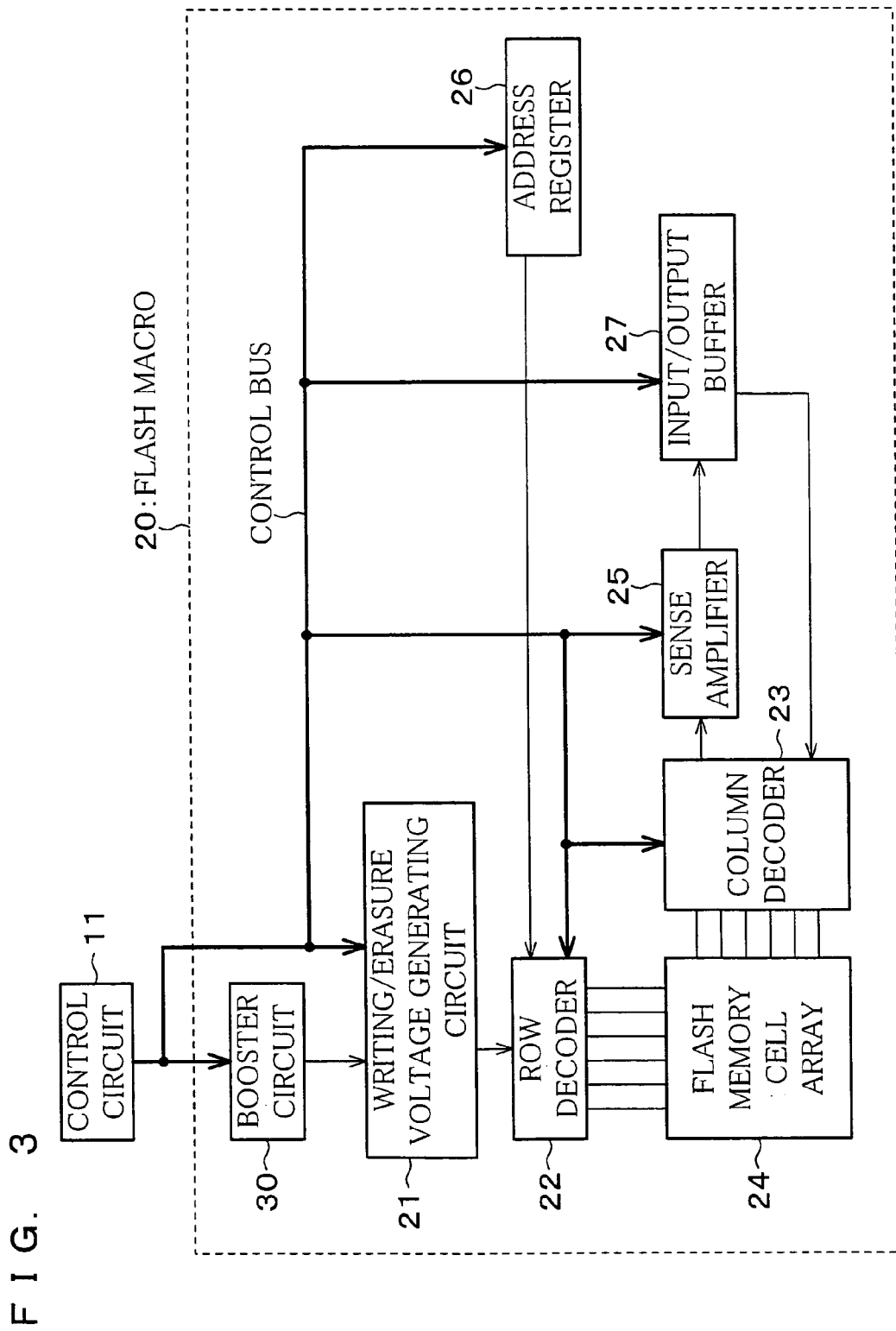
FIG. 3 is a block diagram showing a schematic structure of the flash memory.
Figure 4:
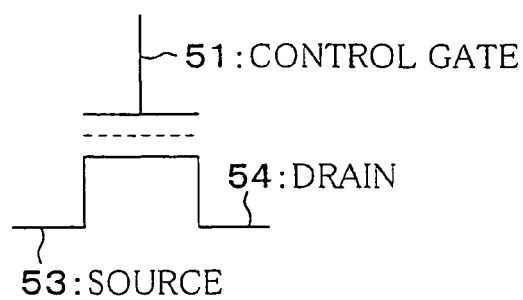
FIG. 4 is a circuit diagram showing a structure of a typical memory cell of the flash memory.

FIG. 3 shows how a flash memory of the present embodiment is arranged. As shown in FIG. 3, the flash memory is constituted by a flash macro 20, and is connected with a control circuit 11. The flash macro 20 includes a booster circuit 30, a writing/erasure voltage generating circuit 21, a row decoder 22, a column decoder 23, a flash memory cell array 24, a sense amplifier 25, an address register 26, and an input/output buffer 27.

According to need, the control circuit 11 controls the booster circuit 30, the writing/erasure voltage generating circuit 21, the row decoder 22, the column decoder 23, the sense amplifier 25, the input/output buffer 27, and the address register 26, via a control bus during read-out operation/rewriting operation.

Figure 5:
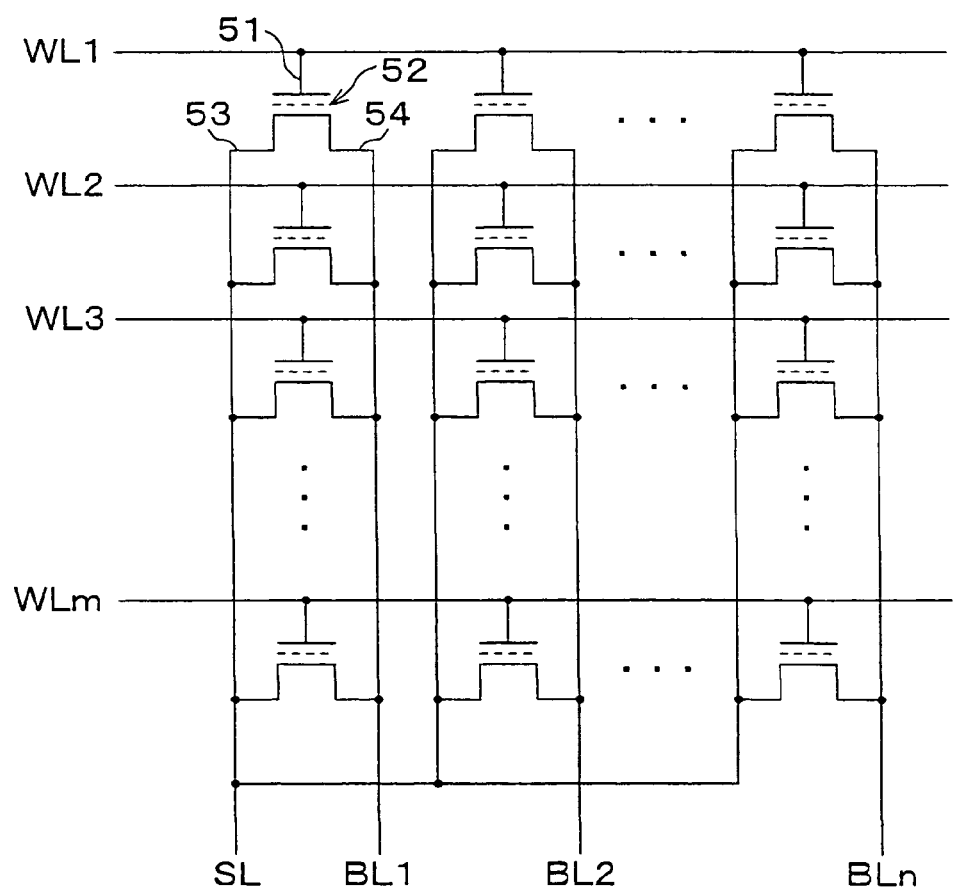
FIG. 5 is a circuit diagram partially showing a structure of a memory cell array including a plurality of the memory cells.

The flash memory cell array 24 has a similar arrangement to the memory cell array shown in FIG. 5 exemplifying a conventional technology. Word lines are connected with the row decoder 22 and bit lines are connected with the column decoder 23.

The booster circuit 30 operates during the writing of data, and generates a high voltage (for example, 12V). The writing/erasure voltage generating circuit 21 generates a high voltage required for the rewriting operation in accordance with the high voltage (for example, 12V) generated by the booster circuit 30. For example, a high voltage (for example, 7V) supplied to a drain of a flash memory cell during the writing is generated as follows. More specifically, the voltage supplied from the booster circuit 30 is stepped down by a regulator circuit (not shown) in the writing/erasure voltage generating circuit 21, and is outputted as the high voltage (for example, 7V). In the meantime, in recent years, a lowering of the power supply voltage has been developed. Some products can operate with a single power supply voltage of 3V. In such products, a voltage of 5V required for the read-out operation is generated by a booster circuit.

The address register 26 generates an address signal which specifies an address in the flash memory cell array 24. With respect to such a address, rewriting operation and read-out operation are carried out. The input/output buffer 27 temporarily stores the data for the rewriting operation and read-out operation to the flash memory cell array 24. The sense amplifier 25 amplifies a signal read out from the flash memory cell array 24.

As mentioned above, the flash memory according to the present embodiment operates with a single power supply voltage, and generates a required high voltage by using the built-in booster circuit 30. Here, the circuitry of the booster circuit 30 is explained with reference to FIG. 2. The booster circuit 30 includes an oscillating circuit 40, a drive signal generating circuit 33, a pump cell circuit 34, a reference voltage generating circuit 31, a comparator 32, and a diode chain 35.

The reference voltage generating circuit 31 is arranged so as to output a constant voltage V13 almost without being affected by a power supply voltage, a temperature, and a manufacturing variation. This voltage V13 is set to 2V, for example.

The voltage V13 generated by the reference voltage generating circuit 31 is supplied to one input terminal of the comparator 32. A voltage V12 is supplied to another input terminal of the comparator 32. The voltage V12 is obtained by stepping down, via the diode chain 35, an output voltage V11 of the booster circuit 30. The comparator 32 compares the voltage value V12 with V13, and outputs a bias signal BIAS for adjusting the oscillation frequency of the oscillating circuit 40. The voltage value of the bias signal BIAS becomes larger as the voltage value V12 is closer to the desired output voltage. Moreover, the oscillation frequency of the oscillating circuit 40 becomes smaller as the output voltage of the booster circuit 30 is closer to a desired output voltage.

The oscillating circuit 40 outputs an oscillating signal OSC in accordance with the bias signal BIAS supplied from the comparator 32. The drive signal generating circuit 33 outputs a drive signal PCLK in accordance with the oscillating signal OSC supplied from the oscillating circuit 40. Upon receipt of the drive signal PCLK, the pump cell circuit 34 carries out the boost operation of the voltage.

A node, to be connected to the comparator 32, in the diode chain 35 is determined such that the voltage value V12 is equal to the voltage value V13 when the booster circuit 30 outputs the desired voltage (for example, 12V). For example, when the output voltage of the reference voltage generating circuit 30 is 2V, it is appropriate that the diode chain 35 includes six diodes connected to each other in series and the first node (the node between the first and second diodes) from the ground side is connected to the comparator 32. This allows the voltage value V12 to become 2V because the voltage value V12 becomes one sixth of the voltage value V11.

The above example deals with the case where the booster circuit 30 is assumed to output a voltage having a positive polarity. However, the present invention is not limited to this. Alternatively, it is also possible to an arrangement in which the booster circuit 30 outputs a voltage having a negative polarity. In this case, as an example, such an arrangement may be realized by replacing the GND voltage with a predetermined positive voltage in the diode chain 35.

Figure 1:
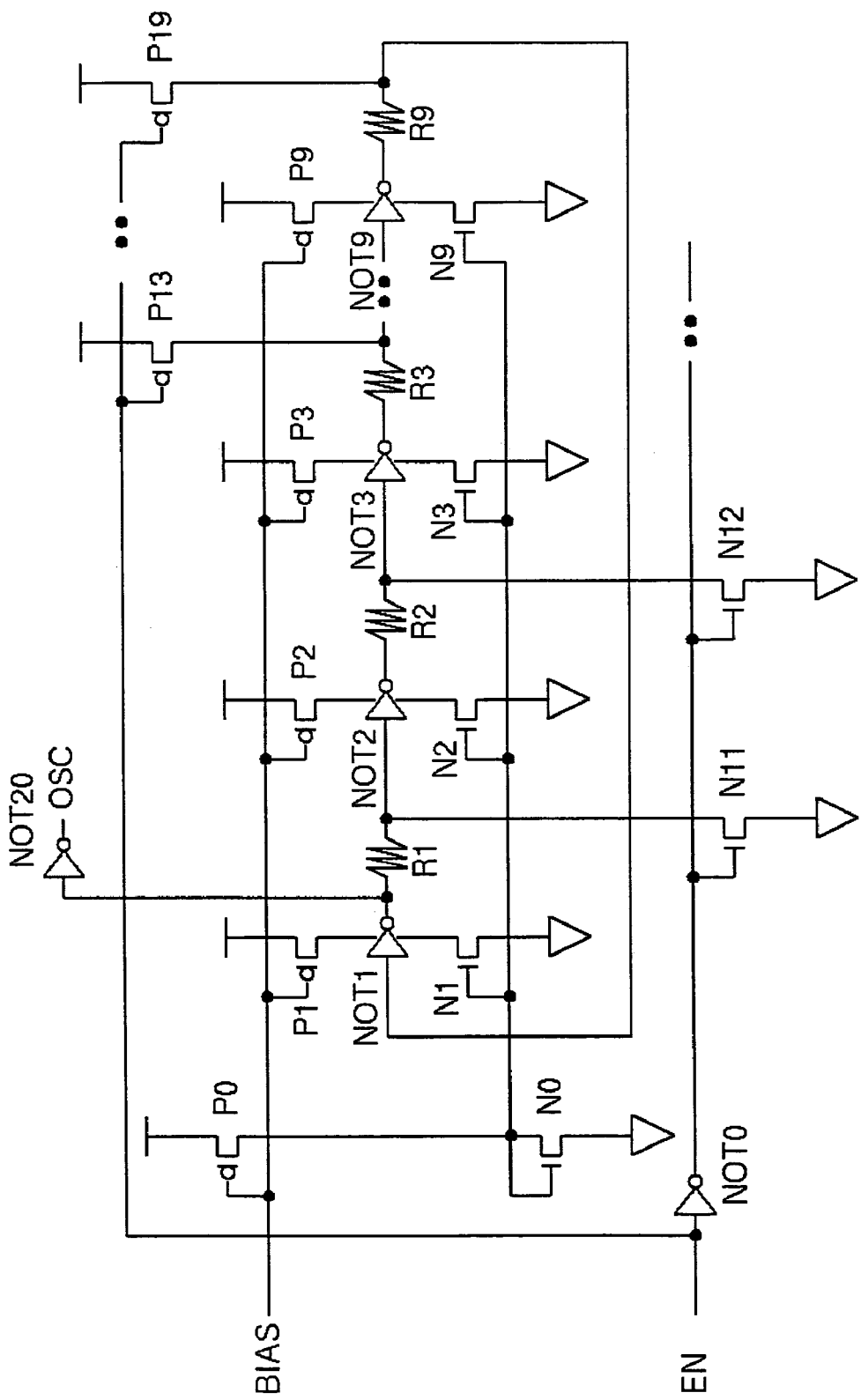
FIG. 1 is a circuit diagram showing a schematic structure of an oscillating circuit, which a flash memory includes, of an embodiment in accordance with the present invention.
Figure 2:
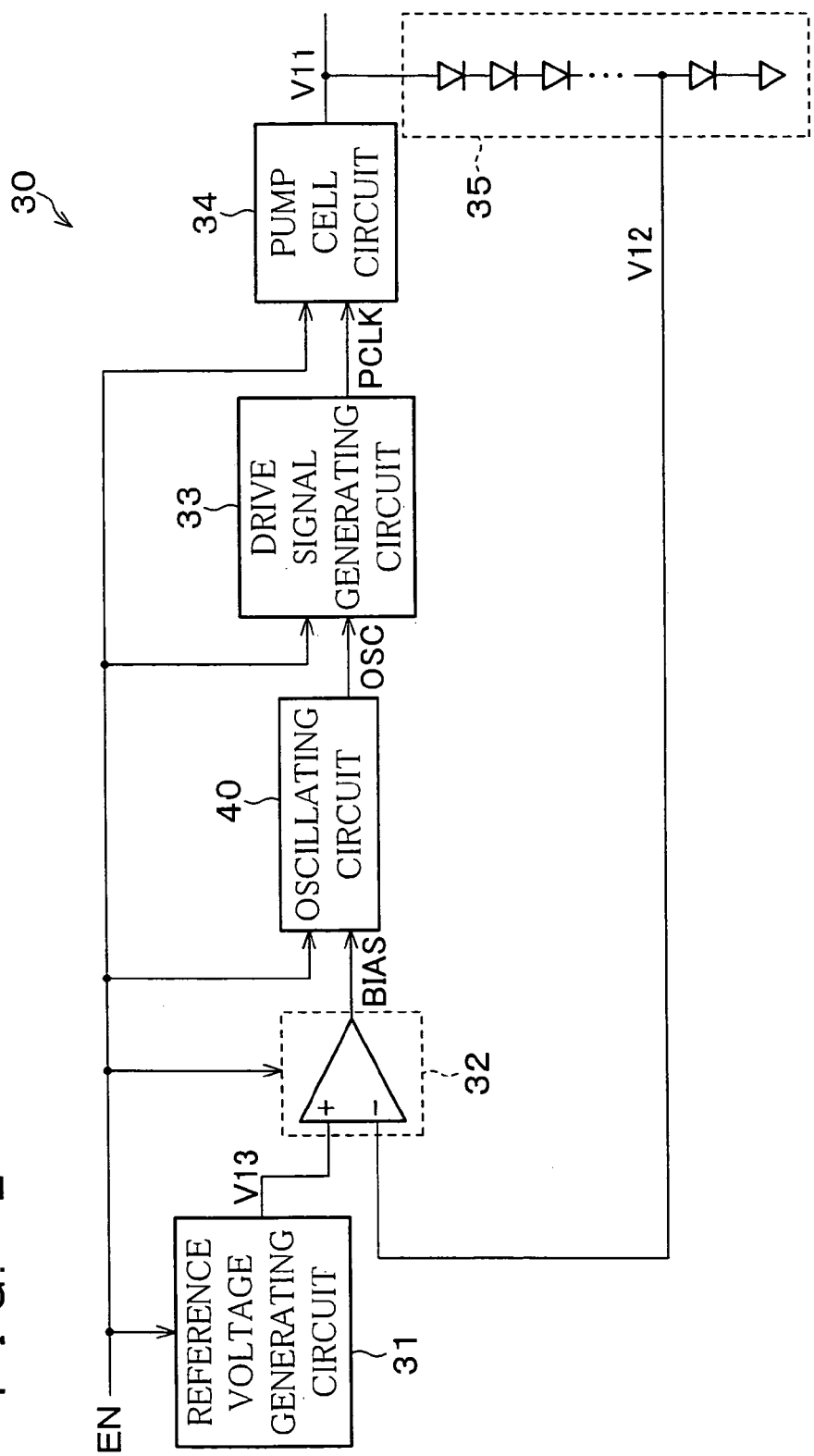
FIG. 2 is a block diagram showing a schematic structure of a booster circuit which the flash memory includes.

FIG. 1 is a circuit diagram showing how the oscillating circuit 40 of the present embodiment is arranged. The oscillating circuit 40 includes (i) a ring oscillator in which inverters NOT1 through 9 of odd number-stage (nine-stage in FIG. 1) are connected to each other in series, (ii) P channel transistors P1 through P9 and N channel transistors N1 through N9 for controlling voltages of the respective inverters NOT1 through NOT9, (iii) an inverter NOT0 for a start-up signal EN, (iv) transistors P0 and N0 for the bias signals BIAS, (v) an inverter NOT20 for an output, and (vi) transistors N11, N12, N14 (not shown), N16 (not shown), N18 (not shown), P13, P15 (not shown), P17(not shown), and P19 which fix voltages of internal nodes during non-start-up.

Moreover, a feature of the oscillating circuit 40 of the present embodiment resides in that not capacitors but resistors R1 through R9 are provided as a delay circuit in the ring oscillator. The resistors R1 through R9 serially follow the inverters NOT1 through NOT9, respectively. For example, the resistor R1 is connected between the inverter NOT1 and the inverter NOT2, and the resistors R2 through R9 are connected in like manner. Note that the operations of the resistors R1 through R9 will be described later.

Here, the ring oscillator in which the inverters NOT1 through NOT9 of nine-stage are connected to each other in series is explained. The signal EN is a start-up signal of this ring oscillator. The signal EN indicates "enable" when it is a High level (for example, Vpp), and indicates "disable" when it is a Low level (for example, GND). Note that the voltage Vpp indicates a writing voltage of the nonvolatile memory device, and can be supplied from the outside or boosted in a semiconductor device.

When the oscillating circuit 40 does not operate, the start-up signal EN becomes Low and the bias signal BIAS becomes High. Under the circumstance, the transistors P1 through P9 via which the power supply line is connected to the inverters NOT1 through NOT9, respectively, turn off, and the transistors N1 through N9 via which the GND line is connected to the inverters NOT1 through NOT9, respectively, turn off. This causes each input or output of the inverters NOT1-NOT9 becomes uncertain. In contrast, when the start-up signal EN becomes Low, the transistors N11, N12, P13 through P19 turn on. This allows the nodes to which the respective transistors N11, N12, P13 through P19 to have certain potentials.

The potential of the bias signal BIAS increases as the output voltage of the booster circuit 30 increases. When the output voltage reaches a desired voltage, the potential of the bias signal BIAS becomes larger than a cut-off voltage of the P channel transistor (for example, larger than Vpp-|Vtp|). This causes the P channel transistors P1 through P9 to turn off so that no power supply is supplied to the inverters NOT1 through NOT9, thereby stopping the oscillation. Note that the oscillation is restarted even after the output voltage reaches the desired voltage, provided that the output voltage of the booster circuit 30 decreases and the bias signal BIAS becomes smaller than a predetermined voltage (for example, lower than Vpp-|Vtp|).

Here, the following description deals with the fact that the dependence of the oscillating frequency with respect to the power supply voltage, the temperature, and the manufacturing variation becomes smaller than the conventional one when the potential of the bias signal BIAS is low and the oscillating frequency becomes the highest one. It should be noted that the dependence of the oscillating frequency with respect to the power supply voltage, the temperature, and the manufacturing variation usually becomes the most remarkable one when the potential of the bias signal BIAS is low and the oscillating frequency becomes the highest one.

When the output voltage of the booster circuit 30 is not yet high enough, the oscillating frequency becomes the highest one and the power consumption also becomes the maximum. This is because of the following reasons as mentioned above. Namely, the P channel transistors P1 through P9 and the N channel transistors N1 through N9 are respectively in the on-state when the potential of the bias signal BIAS is low. This allows the sufficient voltage to be supplied. Thus, the oscillating frequency becomes the highest one, and the current consumption becomes the maximum one, conversely.

The oscillating frequency in the ring oscillator is determined by (i) rise time and fall time of an inverter which constitutes the ring oscillator, and (ii) a delay time of a delay circuit inserted between the inverter and a following inverter. Note that, if wiring which connects the resistors R1 through R9 and the inverters NOT1 through NOT9, shown in FIG. 1, is shortened, then it is possible to realize negligible influence of the delay time due to wiring load. The rise time and the fall time of this inverter vary greatly depending on manufacturing variations, a change in operating temperatures, and a change in power supply voltages (for example, about 2.7 times). However, if the resistances of the resistors R1 through R9 whose manufacturing variations, change in the operating temperatures, and change in the power supply voltages are small is set to a comparatively large value (for example, 20 kΩ), then the rate of the delay time of the resistor circuit to an oscillating cycle becomes large, thereby reducing the variation in the oscillating cycles.

When the polysilicon, which is used for constituting a gate of a transistor, is used as a resistor, i.e., each of the resistors R1 through R9, a layout area can be made small. This is because a sheet resistance of the polysilicon is high (from dozens Ω/□ (ohm per square) to several thousands Ω/□ (ohm per square) ) . Moreover, the polysilicon has a resistance whose change in the operating temperatures and change in the power supply voltages are generally subtle. Accordingly, it is possible to reduce the influence of (i) the operating temperature of the oscillating frequency, and (ii) the power supply voltage. Furthermore, since the manufacturing variations (for example, ±10%) of the resistance of the polysilicon are comparatively small, it is possible to reduce the influence of the manufacturing variations of the oscillating frequency.

The following description deals with the case where the resistors R1 through R9 have the resistances with negative temperature coefficients, respectively. Note that it is assumed that manufacturing variations of the sheet resistance (for example, 4.8 kΩ/□) and the resistance (for example, 20 kΩ) are similar to the above case (for example, ±10%). When the polysilicon has a resistance with a negative temperature coefficient, the resistance becomes larger as the temperature falls. This causes the oscillating frequency to become low. However, the transistor provides a better performance at low temperatures in response to the lowering of the temperature. This allows a pump cell circuit to increase an available output current, thereby increasing the power consumption. That is, it is possible to cancel the increase in the power consumption by lower the oscillating frequency. Note that the polysilicon has a small temperature dependency of the oscillating frequency even if the polysilicon has a resistance with a positive and that the polysilicon has a smaller temperature dependency of the oscillating frequency when the polysilicon has a resistance with a negative temperature coefficient.

Note that it is desirable to use the polysilicon as the resistors R1 through R9. This is because the polysilicon itself has a characteristic in which the resistance has a negative temperature coefficient. However, in recent years, the miniaturization of the wiring width has been developed. This causes the width of the polysilicon to be become narrower, thereby arising the problem that the wiring resistance increases. As an example of methods for lowering the wiring resistance, well known is a method in which titanium silicide is laminated on the polysilicon. The adoption of the method ensures an effect causing the sheet resistance of the polysilicon to be lowered. This, however, may give rise to a case where the resistance has a totally a positive temperature coefficient because such metal is laminated. Even if the resistance has thus a totally positive temperature coefficient, it is possible to improve, as described above, in the temperature dependency of the oscillating frequency according to the arrangement of the present embodiment.

As mentioned above, by adopting the ring oscillator having a circuitry shown in FIG. 1, it was possible to obtain an improvement of about 37.5% in the change in the power supply voltages, the change in the temperatures, and the change in the oscillating frequencies due to the manufacturing variations in the oscillating circuit 40, as compared with the conventional ones, provided that same conditions were maintained. To be more precise, the amount of the change in the oscillating frequency was 25 nsec because the cycle of the oscillating frequency changed from 15 nsec to 40 nsec, according to the conventional example. In contrast, the amount of the change in the oscillating frequency was 10 nsec because the cycle of the oscillation frequency changed from 30 nsec to 40 nsec, according to the present embodiment. As is clear from this, the change in the oscillating frequency was greatly reduced.

Moreover, by suppressing the change in the oscillating frequency, it becomes possible to reduce up to about 60% of the current consumption during the operating of the booster circuit 30 at a maximum speed. For example, the conventional current consumption was about 160 mA, whereas the current consumption was reduced up to about 90 mA in this embodiment. The reduction of the current consumption is explained below with reference to FIG. 7(*a*) through FIG. 7(*d*).

FIG. 7(*a*) shows a rising wave form of a voltage to be supplied as a word line signal of a flash memory during each writing. A wave form indicated as TARGET in FIG. 7(*a*) shows a target rising voltage wave form. Note that an actual rising voltage wave form will change between a wave form indicated as WORST and a wave form indicated as BEST, in accordance with the manufacturing variations, the power supply voltage, and the operating temperature. The change in the voltages happens because the booster performance of the pump cell circuit 34 changes depending on the change in the oscillating frequencies in the oscillating circuit 40. The availability of the current supply of the booster circuit is determined to satisfy the wave form indicated as WORST.

FIG. 7(*b*) shows a wave form of the current consumption in the conventional booster circuit whose circuitry disclosed in Japanese Patent Application Laid-Open (kokai) No. 190798/1996. According to this conventional technology, the circuit is designed to hold a maximum current required during each rewriting. On this account, the oscillating circuit operates so that, when a current consumption goes up with the rise of a voltage and the current consumption current reaches to a certain current, the current consumption is maintained. In this case, it is possible to reduce the current consumption because the current consumption does not go up more than needs during the rise of the voltage. However, the current consumption is kept unchanged after the rising of the voltage. Here, the current for charging the load capacity becomes unnecessary, once a high voltage charges the load capacity. Accordingly, the current more than necessary will continue to be consumed in this structure. That is, in this structure, although the current consumption during the rising of the voltage, can be reduced, there is the problem that the total current consumption increases more than necessary when a steady-state current flows.

Figure 9:
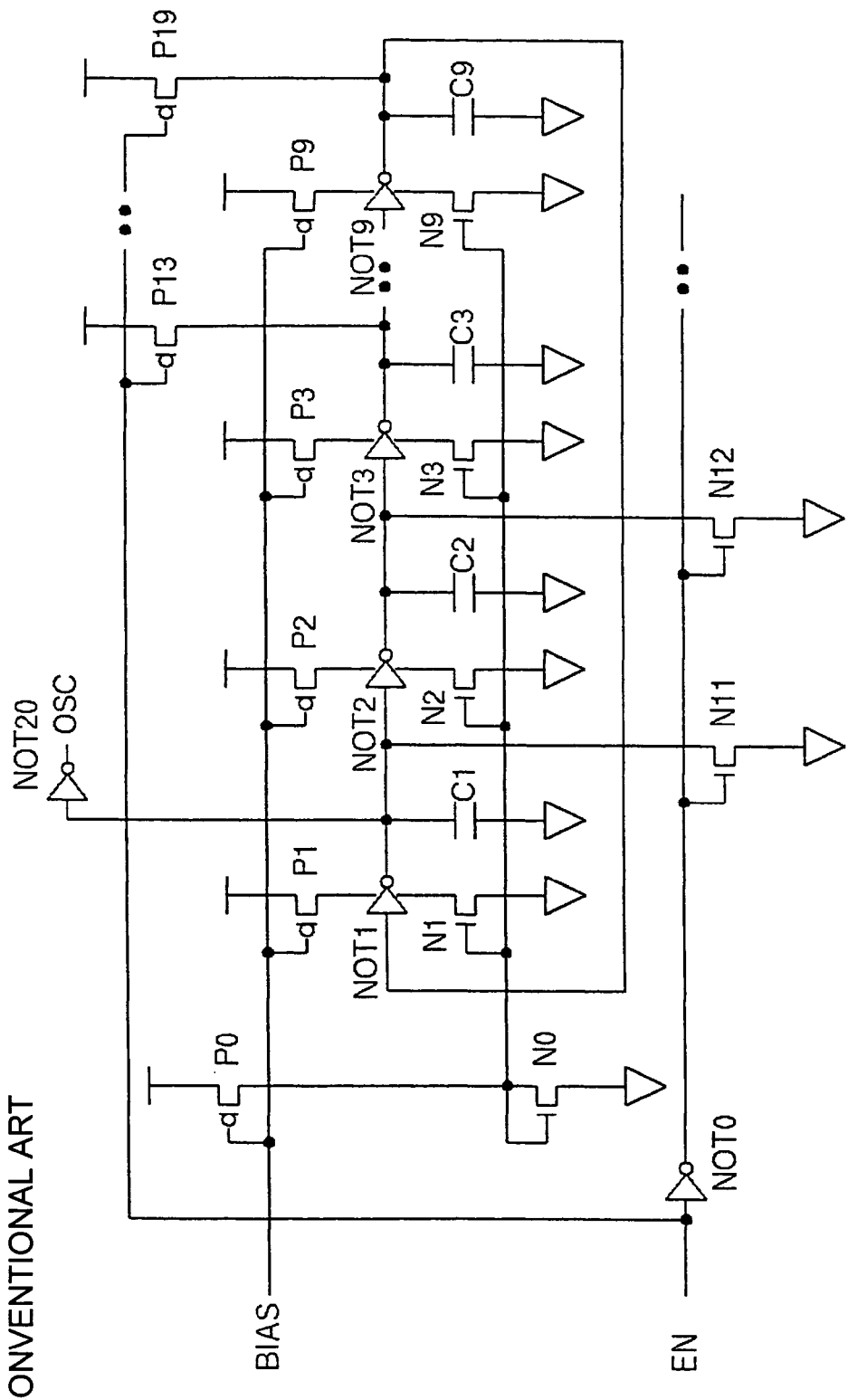
FIG. 9 is a circuit diagram showing a schematic structure of a conventional oscillating circuit.

FIG. 7(*c*) shows a wave form of current consumption in the case where a conventional oscillating circuit shown in FIG. 9 is adopted. With this circuitry, when the voltage steeply rises, the current consumption greatly goes up (about 160 mA), and the voltage reaches and keeps a predetermined voltage. Thereafter, the current consumption goes down so as to reach and keep a constant current consumption. On the other hand, when the voltage slowly rises, the current consumption rises and reaches a lower current consumption (about 55 mA) as compared with the case where the voltage steeply rises, and the voltage reaches and keeps a predetermined voltage. Thereafter, the current consumption goes down so as to reach and keep a constant current consumption.

In this state shown in FIG. 7(*c*), since the current consumption in a steady state is suppressed at a low level as compared with the state shown in FIG. 7(*b*). On this account, the total consumption current in a steady state is reduced, whereas the current consumption during the rising of the voltage becomes remarkably large. That is, when adopting this arrangement, the electric power supply capacity with respect to a flash memory must be designed in consideration of the state in which the current consumption becomes the largest during the rising of the voltage.

To be more precise, the electric power source should secure such a voltage drop that circuits other than the flash memory do not erroneously operate even if the current consumption becomes the largest during the rising of the voltage. Here, as will hereinafter be described in detail, when applying this flash memory to a noncontact IC card, the noncontact IC card has a limited electric power supply capacity. On this account, it will become difficult to design a power source section of the noncontact IC card if the case exists where the electric power consumption becomes remarkably large during the rising of the voltage as mentioned above. In other words, if the above case exists where the electric power consumption becomes remarkably large during the rising of the voltage, then it is likely that the noncontact IC card erroneously operates because of the lowering of the voltage supplied to the circuits other than the flash memory.

FIG. 7(*d*) shows a wave form of the current consumption in case of using the oscillating circuit 40 of the present embodiment. According to the present embodiment, as mentioned above, it is possible to make smaller the change in the oscillating frequency in the oscillating circuit 40. On this account, a range in which the risings of the voltages change (see FIG. 7(*a*)) becomes small. In this case, the peak value of the power consumption in the case where the rising of the voltage is the steepest can be made quite small as compared with FIG. 7(*c*). To be more precise, the peak value of the power consumption is about 90 mA.

That is, according to the present embodiment, it is possible to make lower both the total current consumption in a steady state and the current consumption during the rising of the voltage. That is, according to the present embodiment, it is possible to reduce the current consumption in a stationary state and during the rising of the voltage, respectively. Thus, it is possible to solve the foregoing problem as to the electric power supply capacity.

Figure 8:
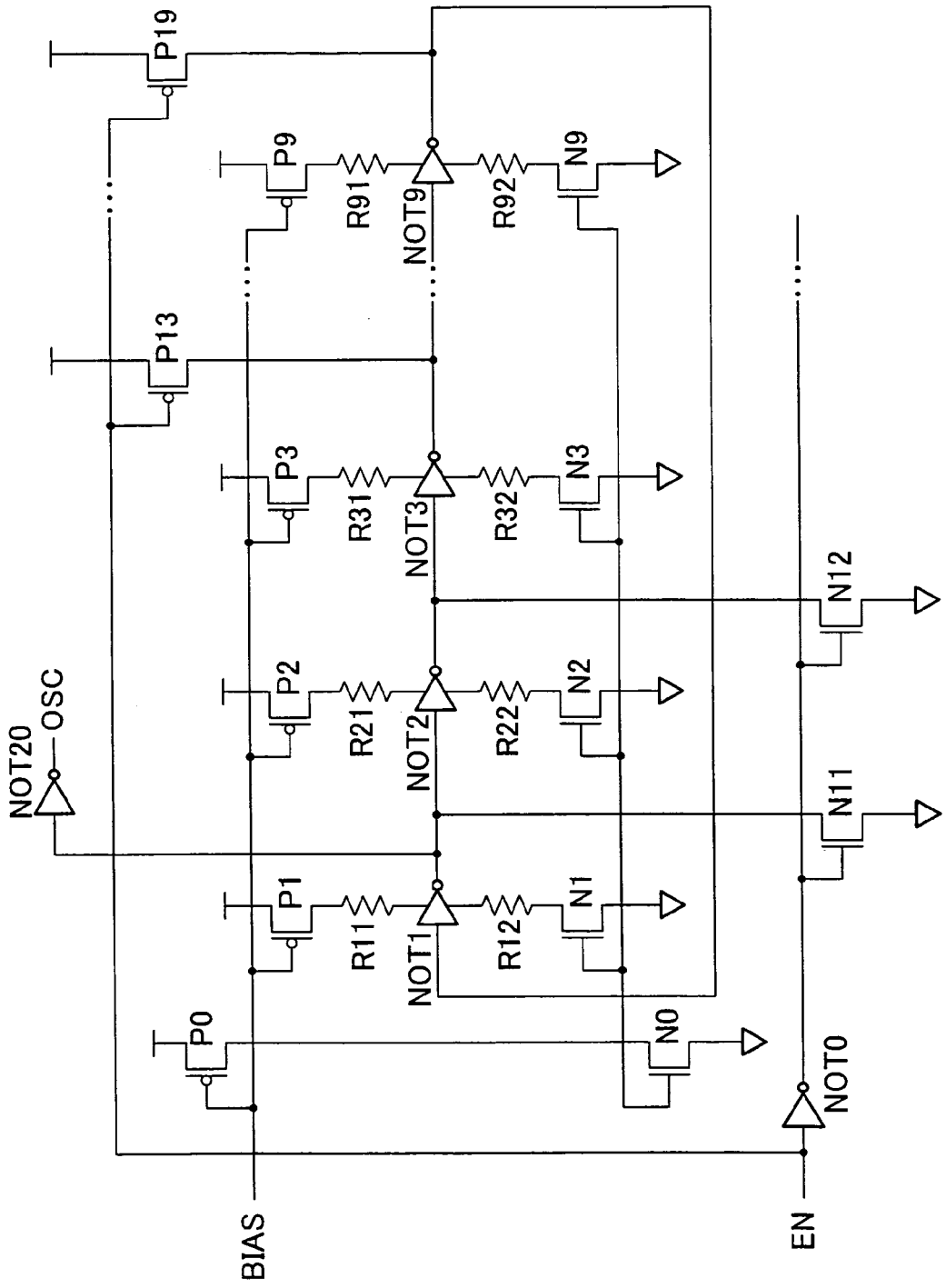
FIG. 8 is a circuit diagram showing a schematic structure, which differs from that shown in FIG. 1, in the oscillating circuit.

The following description deals with how the resistors R1 through R9, each serving as a delay circuit, are inserted in FIG. 1. In the circuitry shown in FIG. 1, the resistors and the inverters are connected in series so that the resistor is provided between the adjacent inverters. However, the way how to insert the resistors is not limited to this example. Alternatively, the resistors may be inserted as shown in FIG. 8. According to the circuitry, (i) a power source is supplied to invertors NOT1 through NOT9 via transistors P1 through P9 and resistors R11 through R91, respectively, and (ii) the invertors NOT1 through NOT9 are grounded via resistors R12 through R92 and transistors N1 through N9, respectively.

Here, like the case where the resistors R1 through R9 are provided, when the resistors R11 through R91 and R12 through R92 have respective resistances that are sufficiently larger than the resistance of a parasitic resistor due to the wiring, it is possible to substantially ignore influences of the parasitic resistor. Therefore, in this case, the delay time is determined by the parasitic capacitance, the resistances of the respective resistors R11 through R91 and R12 through R92. When the resistors R11 through R91 and R12 through R92 have a relatively large resistance (for example, over ten kilo ohms), the current is restricted by the resistors thus inserted within a range in which the power supply voltage changes. This allows the delay time to be substantially constant, thereby reducing the influence of the power supply voltage. That is, like the circuitry shown in FIG. 1, it becomes possible to suppress in the oscillating circuit 40 the change in the oscillating frequency because of the change in the power supply voltages, the change in the temperatures, and the manufacturing variations.

Note that, the circuitry shown in FIG. 8 has both the resistors R11 through R91 and the resistors R12 through R92. However, the similar effect is obtained even in the circuitry in which either the resistors R11 through R91 or the resistors R12 are provided.

Note that the insertion of the resistors shown in FIG. 8 causes the rising and falling time of the inverters NOT1 through NOT9 to become longer than those of FIG. 1. This may give rise to a slight increase in an encircling current of the inverter NOT20 However, there is little influence because the resistance of the resistors inserted is about ten kilo ohms.

In addition, the present invention is not limited to the embodiment mentioned above. As a nonvolatile memory capacity, the present invention can be applied to a memory, such as an EEPROM (electrically erasable/programmable read only memory), which needs a boosted voltage during a rewriting operation. It should be noted that the present invention can be changed and implemented in many ways within such a range that does not deviated from the subject matter of the present invention.

Figure 6:
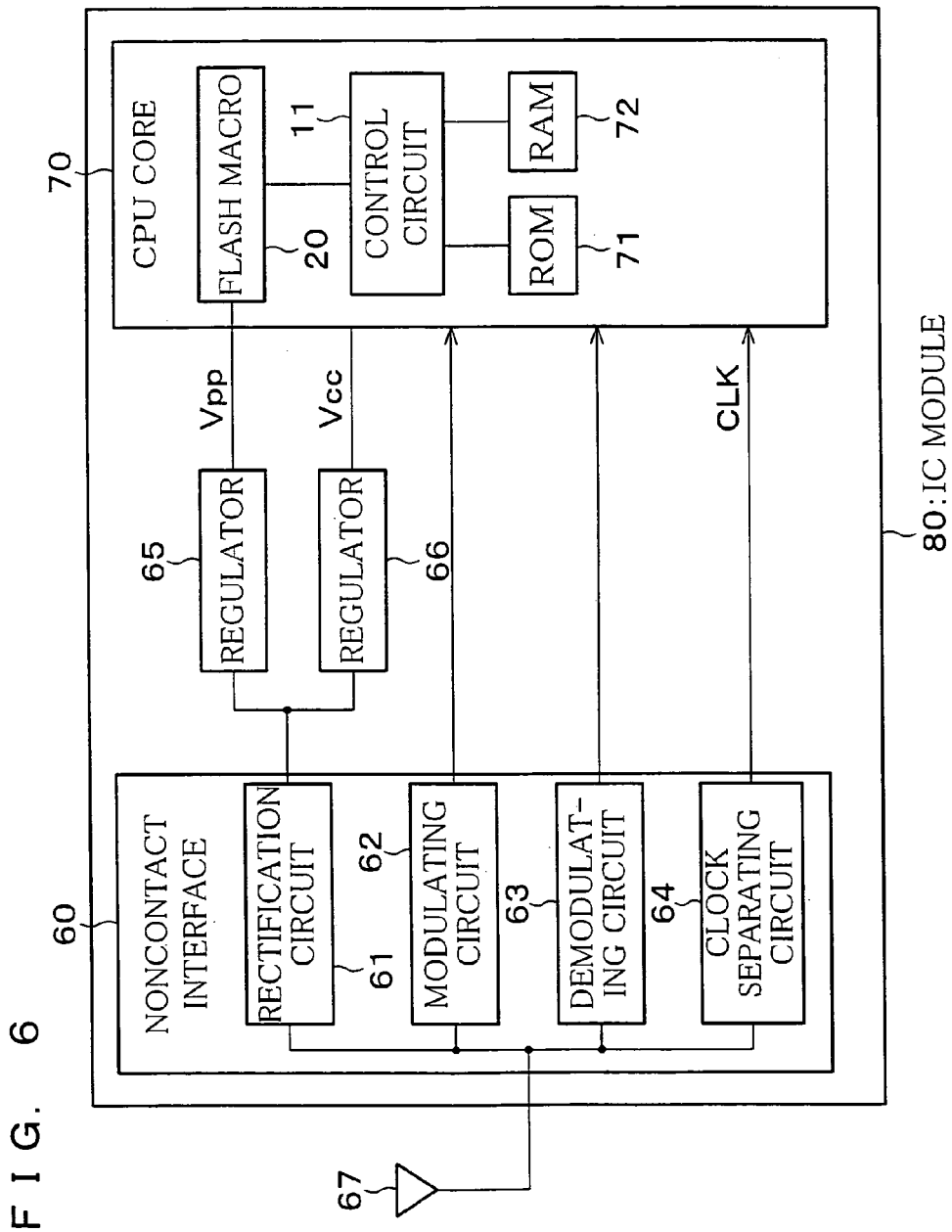
FIG. 6 is a block diagram showing a schematic structure of a noncontact IC card including the flash memory.
Figure 7A:
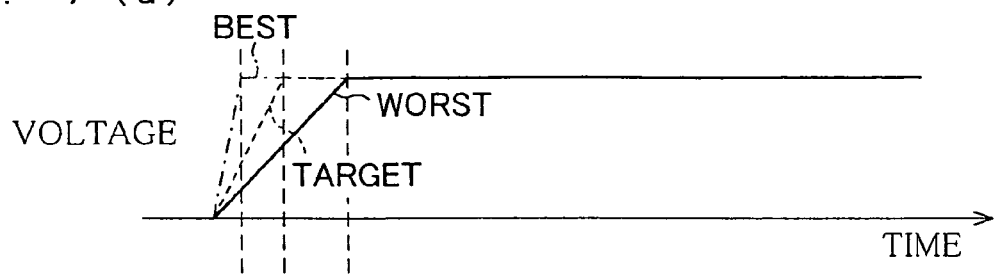
FIG. 7(a) is a wave form chart showing a rise wave form of a voltage to be supplied as a word line signal of a flash memory.
Figure 7B:
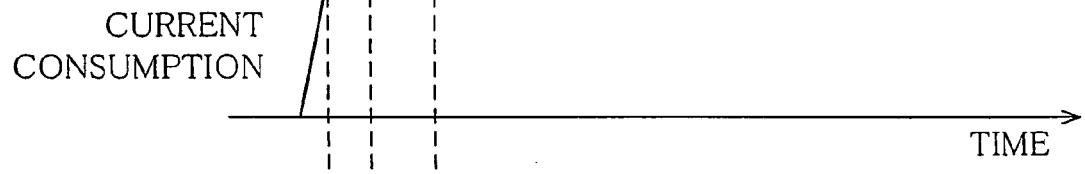
FIG. 7(b) is a wave form chart showing a wave form of the current consumption of a booster circuit which is disclosed in Japanese Patent Application Laid-Open (kokai) No. 190798/1996 in accordance with a conventional technology.
Figure 7C:
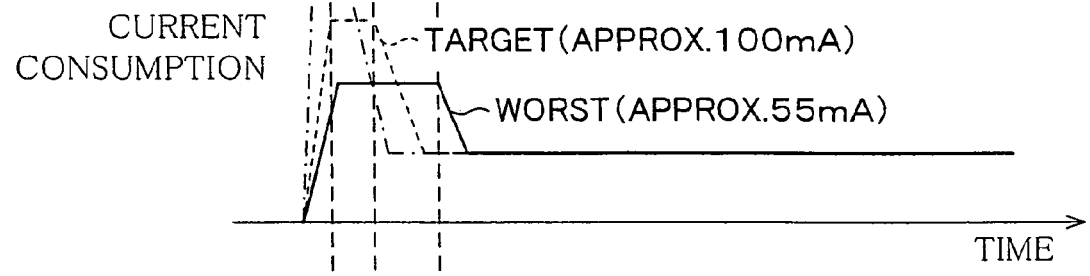
FIG. 7(c) is a wave form chart showing a wave form of the current consumption in the case where the oscillating circuit shown in FIG. 9 is used.
Figure 7D:
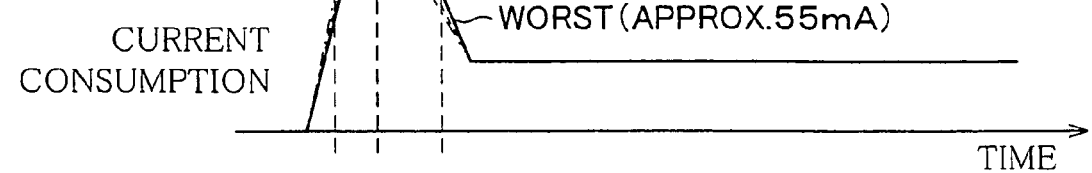
FIG. 7(d) is a wave form chart showing a wave form of the current consumption in the case where the oscillating circuit in the present embodiment is used.

The following description deals with a case where a flash memory in accordance with the present embodiment is applied to a noncontact IC card with reference to a block diagram of FIG. 6. As shown in FIG. 6, the noncontact IC card (semiconductor device) includes an IC module 80 and an antenna 67. The IC module 80 includes a noncontact interface 60, a regulators 65 and 66, and a CPU core (control section) 70.

The noncontact interface 60 is provided for performing a wireless communication and an electric power supply with the external reader/writer devices, and includes a rectification circuit 61, a modulating circuit 62, a demodulating circuit 63, and a clock separating circuit 64. The CPU core 70 includes a control circuit 11 mentioned above, a flash macro 20 as a flash memory, ROM71, RAM72, and other circuits.

The carrier wave transmitted from the reader/writer device is received by the antenna 67 that is suitably arranged for power dispatching. The electric power generated by the electromagnetic induction in the antenna 67 is rectified by the rectification circuit 61. The rectification circuit 61 carries out a full-wave rectification with respect to the electric power so as to output a power source voltage (VCC power source) to the regulators 65 and 66. The regulators 65 and 66 output a voltage Vpp and a voltage Vcc, respectively, to the CPU core 70. A carrier wave form from the rectification circuit 61 is extracted by the clock separating circuit 64 so as to generate a clock signal.

Furthermore, bi-directional data communications are performed using the amplitude modulation method, via the modulating circuit 62 and the demodulating circuit 63,. The signal received is converted into a demodulated signal by the demodulating circuit 63, and is supplied to the CPU core 70. When a transmitter signal is generated by the CPU core 70, the transmitter signal is supplied to the modulating circuit 62. The transmitter signal is converted by the modulating circuit 62 into a signal suitable for the transmitting, and is then transmitted via the antenna 67.

In the noncontact IC card having the arrangement, the operations are carried out in accordance with the feeble electric power supply caused by electromagnetic induction. As such, the reducing of the power consumption is an important task. In view of the circumstances, the flash memory of the present embodiment is used as the nonvolatile memory means in the noncontact IC card, thereby reducing the power consumption. This allows the margin for the electric power supply to increase, thereby reducing the burden of the noncontact communication. Thus, it is possible to carry out more stable communication. In like manner, it is apparent that similar effects can be obtained even when the flash memory of the present embodiment is applied to a combination IC card. The combination IC card is an IC card of noncontact type and contact type, and includes the above-described noncontact type interface and an interface of contact type for carrying out the electric power supply and communication via a terminal or the like, and needless to say, an equal effect is obtained.

As mentioned above, an oscillating circuit in accordance with the present invention includes a ring oscillator in which a plurality of inverters are circularly connected, which outputs a signal whose oscillating frequency changes in response to an inputted voltage, the oscillating circuit, further includes: delay circuits connected to the respective inverters, the delay circuit including a resistor circuit whose resistance sets a time constant of the delay circuit.

Moreover, in the arrangement, an oscillating circuit of the present invention may be arranged so that the resistor circuits and the inverters are provided in series such that the resistor circuit is provided between the adjacent inverters.

According to the arrangement, a resistor circuit is provided between respective adjacent inverters. As such, it becomes possible to efficiently suppress the variation in parasitic resistors caused by the wiring between the inverters, the parasitic resistors having the biggest influence on a time constant in a delay circuit. Therefore, it becomes possible to suppress the variation in the oscillating frequencies of the output signal more effectively.

In addition, in the arrangement, an oscillating circuit of the present invention may be arranged so that the resistor circuit is connected to at least one of a power supply wiring and a ground wiring of the inverter corresponding to the resistor circuit.

Moreover, in the arrangement, an oscillating circuit of the present invention may be arranged so that the resistor circuit has a negative temperature coefficient.

When the resistor circuit has a resistance with a negative temperature coefficient, the resistance becomes larger as the temperature decreases. Here, for example, when an output signal from the oscillating circuit is applied to the booster circuit which performs the boosting of the voltage in accordance with the oscillating frequency of the output signal, the transistor provides a better performance at low temperatures in response to the lowering of the temperature. This allows a pump cell circuit to increase an available output current in response to the lowering of the temperature, thereby increasing the power consumption. Thus, when the resistor circuit has a negative temperature coefficient, the oscillating frequency lowers in response to the lowering of the temperature. As such, it is possible to cancel the increase in the power consumption in the pump cell circuit Moreover, in the arrangement, an oscillating circuit of the present invention may be arranged so that the resistor circuit is made of a polysilicon.

Since the polysilicon has a comparatively high sheet resistance, it is possible to make smaller a layout area of the resistor circuit. This makes it possible to reduce the size of the oscillating circuit. As such, it becomes possible to be preferably used for portable devices that are desired to be as small as possible.

Moreover, since the polysilicon resistor has a temperature coefficient smaller than that of a sheet resistor of a metal wiring for example, it is possible to reduce the influence of operating temperatures of the oscillating frequency.

Moreover, since the manufacturing variations of the polysilicon resistor are smaller than those of the sheet resistor of the metal wiring for example, it is possible to reduce the influence of the manufacturing variations of the oscillating frequency.

Moreover, in the arrangement, an oscillating circuit of the present invention may be arranged so that the resistor circuit is made of a polysilicon on which a titanium silicide is laminated.

As compared with a polysilicon of a simple substance, the resistance of the polysilicon on which the titanium silicide is laminated becomes smaller. Therefore, even when the miniaturization of a wiring is required in order to make the size of an oscillating circuit small, it becomes possible to prevent the resistance of a resistor circuit from becoming larger than necessary. That is, according to the arrangement, it is possible to miniaturize a wiring of a resistor circuit, thereby reducing the size of the oscillating circuit.

Moreover, a booster circuit of the present invention includes an oscillating circuit of the present invention; and a pump cell circuit which carries out a booster operation of a voltage in accordance with an oscillating frequency of a signal outputted from the oscillating circuit.

Moreover, a nonvolatile memory device of the present invention includes a booster circuit of the present invention; and an electrically rewritable nonvolatile memory device element, wherein: a rewriting operation to the nonvolatile memory device element is carried out in accordance with the voltage generated by the booster circuit.

Moreover, in the arrangement, a nonvolatile memory device of the present invention may be, arranged so that the nonvolatile memory element is a flash memory cell array including a plurality of flash memory cells.

With the arrangement, the nonvolatile memory element is constituted by the flash memory cell array. A flash memory cell needs comparatively high voltage during writing and erasure operations. Therefore, because of the above booster circuit, the operations can be done with a single power source. As such, it becomes unnecessary to generate the high voltage, required for the rewriting of the nonvolatile memory, outside a tip, thereby cutting down the number of the circuit components.

Moreover, a semiconductor device of the present invention includes a nonvolatile memory device of the present invention; and a control section which controls writing, erasure, and read-out operations to the nonvolatile memory device.

Moreover, in the arrangement, a semiconductor device of the present invention may be arranged so as to further include a noncontact interface which performs power supply and data communication from an external device in a noncontact manner.

In the arrangement, the electric power supply and the data communications are performed from the external device in a noncontact manner. Thus, in an arrangement in which the electric power supply is performed in a noncontact manner, the reducing of the power consumption is an important task. In view of the circumstances, the nonvolatile memory device of the present embodiment is used, thereby reducing the power consumption. This allows the margin for the electric power supply to increase, thereby reducing the burden of the noncontact communication. Thus, it is possible to carry out more stable communication.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

An oscillating circuit of the present invention can be used as a circuit that generates a signal for controlling a booster circuit that generates a voltage needed during each rewriting operation of the nonvolatile memory device, such as a flash memory, the booster circuit being controlled in accordance with a frequency of such a signal. Moreover, a nonvolatile memory device of the present invention can be suitably used as memory means such as a noncontact IC card in which the electric power supply is not comparatively stable. This is because the nonvolatile memory device can reduce the power supply that is needed.

The invention claimed is:

1. An oscillating circuit, comprising:
   a ring oscillator including a plurality of inverters circularly connected, said ring oscillator outputs a signal whose oscillating frequency changes in response to an inputted voltage; and
   delay circuits connected to said respective inverters,
   said delay circuit including a resistor circuit whose resistance sets a time constant of the delay circuit, wherein the resistor circuit has a negative temperature coefficient.

2. The oscillating circuit as set forth in claim 1, wherein the resistor circuits and the inverters are provided in series such that the resistor circuit is provided between adjacent inverters.

3. The oscillating circuit as set forth in claim 1, wherein the resistor circuit is connected to at least one of a power supply wiring and a ground wiring of the inverter corresponding to the resistor circuit.

4. The oscillating circuit as set forth in claim 1, wherein the resistor circuit is made of a polysilicon.

5. The oscillating circuit as set forth in claim 2, wherein the resistor circuit is made of a polysilicon.

6. The oscillating circuit as set forth in claim 3, wherein the resistor circuit is made of a polysilicon.

7. The oscillating circuit as set forth in claim 2, wherein the resistor circuit has a positive temperature coefficient.

8. The oscillating circuit as set forth in claim 3, wherein the resistor circuit has a positive temperature coefficient.

9. An oscillating circuit, comprising:
   a ring oscillator including a plurality of inverters circularly connected, said ring oscillator outputs a signal whose oscillating frequency changes in response to an inputted voltage; and
   delay circuits connected to said respective inverters,
   said delay circuit including a resistor circuit whose resistance sets a time constant of the delay circuit, wherein the resistor circuit has a positive temperature coefficient.

10. The oscillating circuit as set forth in claim 9, wherein the resistor circuit is made of a polysilicon on which a titanium suicide is laminated.

11. A booster circuit, comprising:
    an oscillating circuit, the oscillating circuit including:
    a ring oscillator including a plurality of inverters circularly connected, said ring oscillator outputs a signal whose oscillating frequency changes in response to an inputted voltage, and
    delay circuits connected to said respective inverters,
    said delay circuits each including a resistor circuit whose resistance sets a time constant of the delay circuits; and
    a pump cell circuit which carries out a booster operation of a voltage in accordance with the oscillating frequency of the signal outputted from the oscillating circuit, wherein the resistor circuit has a negative temperature coefficient.

12. A nonvolatile memory device, comprising:
    a booster circuit, the booster circuit comprising:
    an oscillating circuit, the oscillating circuit including:
    a ring oscillator including a plurality of inverters circularly connected, said ring oscillator outputs a signal whose oscillating frequency changes in response to an inputted voltage, and
    delay circuits connected to said respective inverters,
    said delay circuits each including a resistor circuit whose resistance sets a time constant of the delay circuits;
    a pump cell circuit which carries out a booster operation of a voltage in accordance with the oscillating frequency of the signal outputted from the oscillating circuit; and
    an electrically rewritable nonvolatile memory device, wherein:
    a rewriting operation to the nonvolatile memory device is carried out in accordance with the voltage generated by the booster circuit.

13. The nonvolatile memory device as set forth in claim 12, wherein the nonvolatile memory element is a flash memory cell array including a plurality of flash memory cells.

14. A semiconductor device, comprising:
    a nonvolatile memory device, the nonvolatile memory device including:
    a booster circuit, the booster circuit comprising:
    an oscillating circuit, the oscillating circuit including:
    a ring oscillator including a plurality of inverters circularly connected, said ring oscillator outputs a signal whose oscillating frequency changes in response to an inputted voltage, and
    delay circuits connected to said respective inverters,
    said delay circuits each including a resistor circuit whose resistance sets a time constant of the delay circuits;
    a pump cell circuit which carries out a booster operation of a voltage in accordance with the oscillating frequency of the signal outputted from the oscillating circuit;
    an electrically rewritable nonvolatile memory device, wherein:
    a rewriting operation to the nonvolatile memory device is carried out in accordance with the voltage generated by the booster circuit; and
    a control section which controls writing, erasure, and read-out operations to the nonvolatile memory device.

15. The semiconductor device as set forth in claim 14, further comprising:
    a noncontact interface which performs power supply and data communication from an external device in a noncontact manner.

16. The semiconductor device as set forth in claim 14, further comprising:
    a contact interface which performs power supply and data communication from an external device via a contact terminal.

17. The semiconductor device as set forth in claim 15, further comprising:
    a contact interface which performs power supply and data communication from an external device via a contact terminal.

18. A booster circuit, comprising:
    an oscillating circuit, the oscillating circuit including:
    a ring oscillator including a plurality of inverters circularly connected, said ring oscillator outputs a signal whose oscillating frequency changes in response to an inputted voltage, and
    delay circuits connected to said respective inverters,
    said delay circuits each including a resistor circuit whose resistance sets a time constant of the delay circuits; and
    a pump cell circuit which carries out a booster operation of a voltage in accordance with the oscillating frequency of the signal outputted from the oscillating circuit, wherein the resistor circuit has a positive temperature coefficient.

* * * * *